United States Patent
Park

(10) Patent No.: US 6,627,979 B2
(45) Date of Patent: Sep. 30, 2003

(54) SEMICONDUCTOR PACKAGE AND FABRICATION METHOD OF THE SAME

(75) Inventor: Kye Chan Park, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/167,702

(22) Filed: Jun. 12, 2002

(65) Prior Publication Data

US 2002/0190354 A1 Dec. 19, 2002

(30) Foreign Application Priority Data

Jun. 15, 2001 (KR) .................................. 10-2001-33946

(51) Int. Cl.[7] .......................... H01L 23/28; H01L 23/31; H01L 23/495
(52) U.S. Cl. .................... 257/667; 257/687; 257/723
(58) Field of Search ......................... 257/667, 685–687, 257/723

(56) References Cited

U.S. PATENT DOCUMENTS

| | | | |
|---|---|---|---|
| 5,130,275 A | * | 7/1992 | Dion .......................... 438/614 |
| 5,786,230 A | | 7/1998 | Anderson et al. |
| 6,121,682 A | | 9/2000 | Kim |
| 6,239,367 B1 | * | 5/2001 | Hsuan et al. .............. 174/52.4 |
| 6,291,264 B1 | * | 9/2001 | Tang et al. ................. 438/106 |
| 6,365,432 B1 | | 4/2002 | Fukutomi et al. |
| 6,437,990 B1 | * | 8/2002 | Degani et al. ............. 361/783 |

* cited by examiner

Primary Examiner—Allan R. Wilson
(74) Attorney, Agent, or Firm—Timothy J. Keefer; Wildman, Harrold, Allen & Dixon

(57) ABSTRACT

Disclosed is a semiconductor package capable of realizing a small and compact size and improving the reliability and the fabrication method of the same. The disclosed comprises: a main semiconductor chip having a plurality of main chip pads and operating as a lead frame or a substrate; a plurality of metal patterns electrically connected to each corresponding main chip pad and having electrodes formed on both ends; one or more sub semiconductor chip adhered to the main semiconductor chip by adhering bumps formed on a plurality of sub chip pads to each corresponding electrode; a dam formed on the main semiconductor chip in a shape surrounding the inner electrodes except for the outer electrodes on the outmost region of the main semiconductor chip; filling materials filled up in the dam; and a plurality of solder balls adhered on the outmost electrodes.

9 Claims, 8 Drawing Sheets

SEMICONDUCTOR PACKAGE AND FABRICATION METHOD OF THE SAME

CROSS REFERENCE TO RELATED APPLICATION

This application claims the priority of Korean patent application Serial No. 2001-33946 filed on Jun. 15, 2001.

BACKGROUND OF THE INVENTION

1. Field of the Invention

The present invention relates to a semiconductor package and, more particularly to a multi-type semiconductor package comprising a plurality of semiconductor chips and a fabrication method thereof.

2. Description of the Prior Arts

Recently, electronic apparatuses using semiconductor chips (semiconductor device), for example computer, PCS, cellular phone and PDA, have become of high performance, simpler to fabricate and smaller and more compact in the size. Accordingly, semiconductor chips and semiconductor packages applied to the electronic system also become smaller and more compact.

As is generally known, package methods of semiconductor chips include Multi Chip Module (MCM) package and Multi Chip Package (MCP).

The MCM package is a method that a plurality of semiconductor chips are adhered on a thin metal film, ceramic or substrate. Referring to FIG. 4, a plurality of semiconductor chips 402, 404 and 406 are adhered on a base 400 such as a thin metal film, ceramic or substrate using wire bonding, tape bonding or flip chip bonding.

Referring to FIG. 3, the first semiconductor chip 402 is adhered by wire bonding, the second semiconductor chip 404 is adhered by tape bonding and the third semiconductor chip 406 is adhered by flip chip bonding, wherein a reference numeral 408 represents a PGA input/output terminal and 410 represents a BGA input/output terminal.

The MCP is a method that two or more semiconductor chips are mounted in a package of defined size, wherein a plurality of semiconductor chips are mounted on a lead frame or substrate using wire bonding. Referring to FIG. 5, a plurality of semiconductor chips 504a and 504b are loaded on a substrate 502 using wire bonding and pads of the semiconductor chips 504a and 504b are connected to an external lead 506 by a wire 508, wherein the resulting structure is surrounded by epoxy molding compound (EMC) 500.

However, the conventional MCM package and the MCP have limitations in realizing a small and compact size due to the structure that a plurality of semiconductor chips are adhered on a base such as a thin metal film, ceramic or substrate using wire bonding, tape bonding or a flip chip bonding, or that a plurality of semiconductor chips are mounted on a substrate using wire bonding and then, surrounded by epoxy molding compound.

And, the conventional package has a structure that a pad of semiconductor chip and the external lead are connected by wire, thereby there arises a problem of lowering the quality and reliability of semiconductor package (that is, degradation of electrical properties) and especially, the conventional package using EMC has a problem that reliability of semiconductor package is lowered drastically by alpha particle generated in the epoxy molding compound (EMC) and pollution in active region of device by EMC.

SUMMARY OF THE INVENTION

Therefore, the present invention has been proposed to solve the above problems and the primary objective of the present invention is to provide a semiconductor package capable of realizing a small and compact size and improving the reliability and the fabrication method of the same.

In order to accomplish the above objectives, the semiconductor package including a plurality of electrically-connected semiconductor chips according to the present invention comprises: a main semiconductor chip having a plurality of main chip pads and operating as a lead frame or a substrate; a plurality of metal patterns electrically connected to each corresponding main chip pad and having electrodes formed on both ends; one or more sub semiconductor chip adhered to the main semiconductor chip by adhering bumps formed on a plurality of sub chip pads to each corresponding electrode; a dam formed on the main semiconductor chip in a shape surrounding the inner electrodes except for the outer electrodes on the outmost region of the main semiconductor chip; filling materials filled up in the dam; and a plurality of solder balls adhered on the outmost electrodes.

In order to accomplish the above object, a method of fabricating semiconductor package including a plurality of electrically-connected semiconductor chips of the present invention comprises the steps of: a first process of forming a plurality of metal patterns connected to each corresponding main chip pad on the main semiconductor chip operating as a lead frame or a substrate and having electrodes formed on both ends thereof; a second process of forming a bump on each sub chip pad of sub semiconductor chip; a third process of adhering the sub semiconductor chip to the main semiconductor chip by adhering the bump to each corresponding electrode: a fourth process of forming a dam on the main semiconductor chip in a shape surrounding inner electrodes except for outer electrodes on the outmost region of the main semiconductor chip and then, filling up the inside thereof with filling materials; and a fifth process of adhering solder balls to the outmost electrodes.

DETAILED DESCRIPTION OF THE INVENTION

The objects and features of the invention may be understood with reference to the following detailed description of an illustrative embodiment of the invention, taken together with the accompanying drawings.

FIGS. 1A to 1F are drawings showing a process of forming a metal pattern and an electrode on a main semiconductor chip to fabricate a semiconductor package according to the present invention.

Figure 1A:
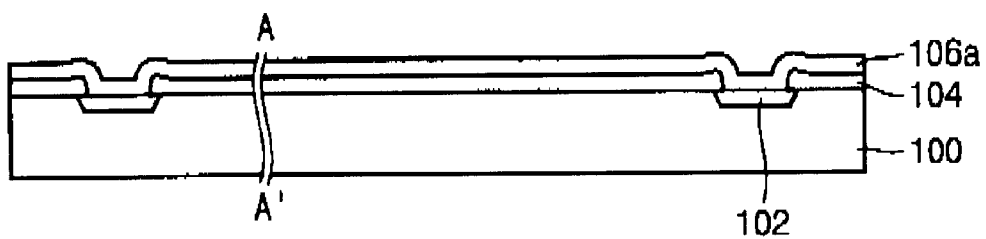
FIGS. 1A to 1F are drawings showing a process of forming a metal pattern and an electrode on a main semiconductor chip to fabricate a semiconductor package according to the present invention.

Referring to FIG. 1A, a plurality of main chip pads 102 are formed along the outer peripheral region of a semiconductor chip operating as a lead frame or a substrate and then, a first protecting layer 104 is formed thereon except for the main chip pad 102. Thereafter, deposition process, such as sputtering and evaporation, is performed on the entire surface of the main semiconductor chip 100, thereby forming a lower barrier material 106a. Compounds such as Ti/W, Cr+Ni, Ti/W+Ni or Cr+Co+Ni may be mentioned as examples of the lower barrier material 106a. The thickness of the lower barrier material 106a is preferably in the range of 2000 to 5000 Å.

Figure 1B:
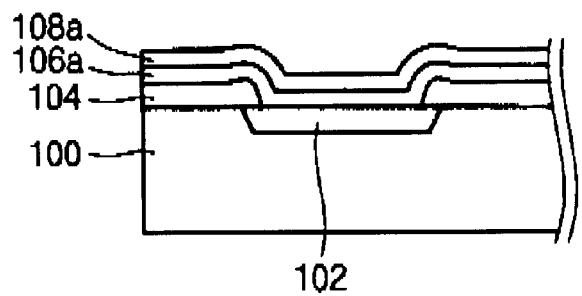

Referring to FIG. 1B, a deposition process is performed to form a seed material 108 having a predetermined thickness on the entire surface of the main semiconductor chip 100 including the lower barrier material 106a, wherein Cu, Au, Cr and Ni may be mentioned as examples of seed material 108a. The thickness of the seed material 108a is preferably in the range of 1 to 5 μm.

Figure 1C:
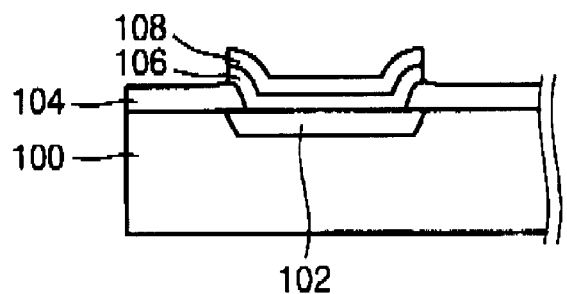

Subsequently, a photoresist is formed on the entire surface of the main semiconductor chip 100 having the seed material thereon and the photoresist is selectively removed by exposure and development processes. That is, the photoresist is selectively removed except for the upper part of the main chip pad 102. And then, etch process is performed by using the remaining photoresist as an etch mask, thereby removing a part of the seed material 108a and the lower barrier material 106a (a part of the first protecting layer 104 is exposed). Subsequently, the remaining photoresist is removed to form a lower barrier layer 106 and a seed layer 108 on the main chip pad 102, as shown in FIG. 1C. Herein, the lower barrier layer 106 is formed to prevent diffusion and to increase adhesive power.

Figure 1D:
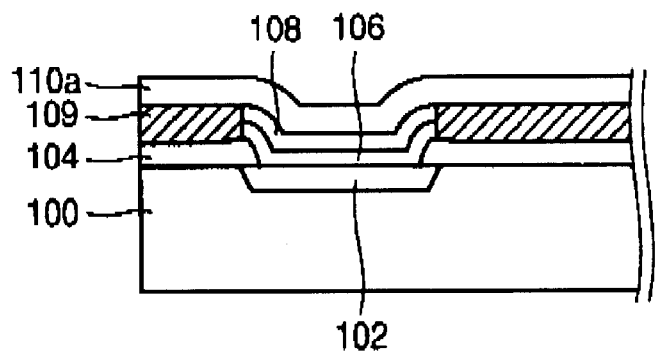

Referring to FIG. 1D, an insulating layer 109 such as nonconductive polyimide or polymer is coated to the height of the seed layer 108 on the entire surface except for the upper part of the seed layer 108. And deposition and coating processes are performed to form a metal layer 11a having a predetermined thickness on the entire surface. Compounds such as Cu, Ni+Cu, Cu+Ni+Au and Cu+Au may be mentioned as examples of the metal material 110a. The thickness of the metal material 110a is preferably in the range of 2 to 10 μm.

Figure 1E:
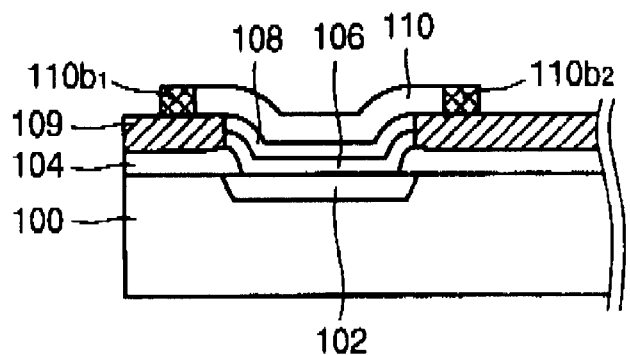
Figure 1F:
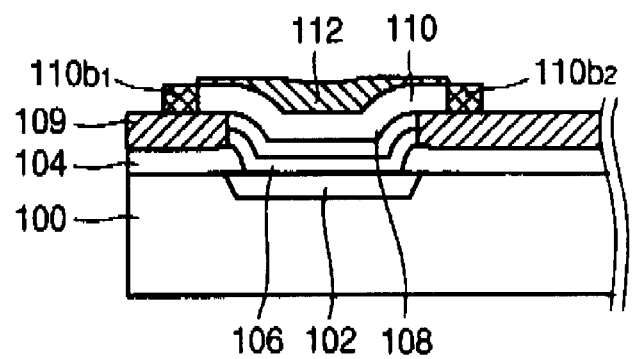

Referring to FIG. 1E, an etch mask is formed in a predetermined shape on the metal material 110a by performing processes of photoresist application, exposure and development. Then, etch process is performed by using the etch mask to form a metal layer 110 extended from the upper part of the seed layer 108 to the upper part of the insulating layer 109, thereby obtaining a metal pattern comprising the lower barrier layer 106, the seed layer 108 and the metal layer 110.

At both ends of the metal layer 110, electrodes 110b1 and 110b2 are formed in a shape of circle or rectangle. When the electrode is formed in a shape of circle, the diameter of the inner electrode 110b2 of the main semiconductor chip 100 has a size of 0.1 mm to 1 mm and when it is formed in a shape of rectangle, the size is preferably in the range of 0.1 mm×0.1 mm to 1 mm×1 mm. When the electrode is formed in a shape of circle, the diameter of the outer peripheral electrode 110b1 of the main semiconductor chip 100 has a size of 0.3 mm to 3 mm and when it is formed in a shape of rectangle, the size is preferably in the range of 0.3 mm×0.3 mm to 3 mm×3 mm.

And, a solder bump, which is formed on a sub semiconductor chip by a later process, is adhered on the electrodes 110b1 and 110b2.

Finally, the photoresist (etch mask) remaining on the metal layer 110 is removed and then, a second protecting layer 112 is formed on the metal layer 110 except for the electrodes 110b1 and 110b2, thereby completing the fabrication process of main semiconductor chip.

Figure 2A:
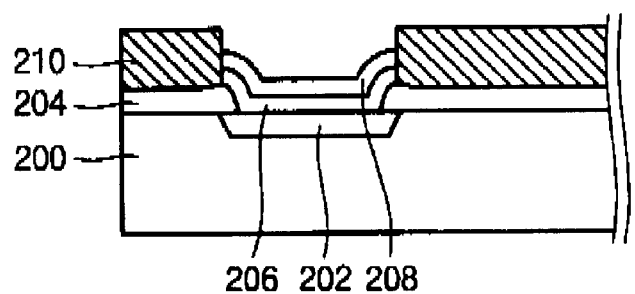
FIGS. 2A to 2C are drawings showing a process of forming a solder or a gold bump on a sub semiconductor chip to fabricate a semiconductor package according to the present invention.
Figure 2B:
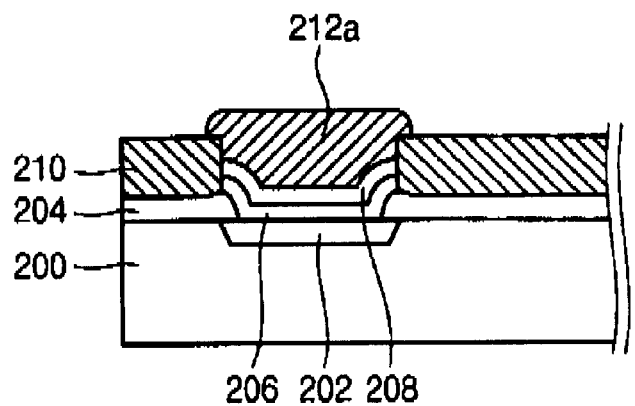
Figure 2C:
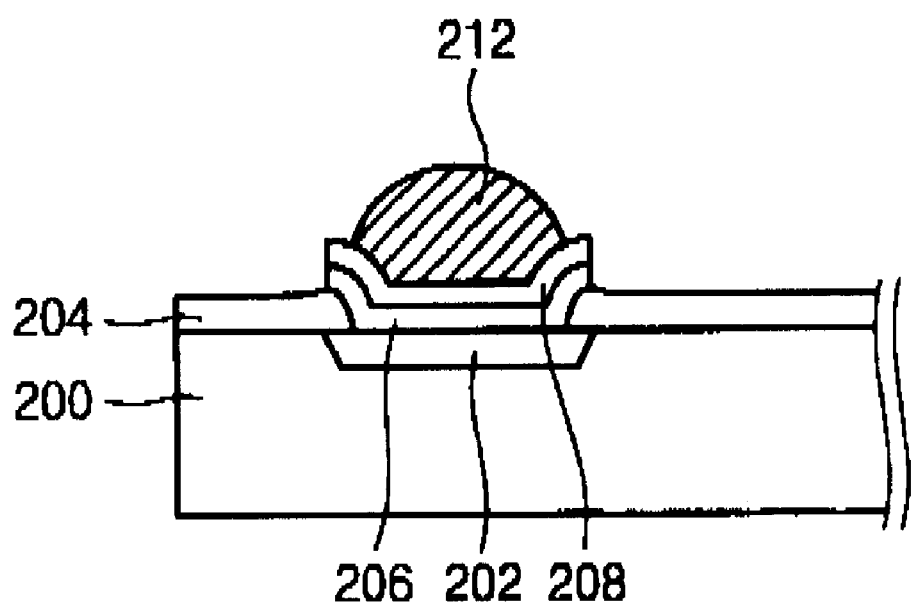

FIGS. 2A to 2C are drawings showing a process of forming a solder or a gold bump on a sub semiconductor chip to fabricate a semiconductor package according to the present invention.

Referring to FIG. 2A, a lower barrier layer 206 and a seed layer 208 are sequentially formed on a sub chip pad 202 of the sub semiconductor chip 200. Then, a photoresist 210 is applied on the entire surface of the sub semiconductor chip 200 and exposure and development processes are performed to selectively remove the photoresist 210, that is, the photoresist on the seed layer 208, thereby exposing the upper part of the seed layer 208. The lower barrier layer 206 and the seed layer 208 are made of the similar materials to the main semiconductor chip 100 and have the similar thickness thereto.

Referring to FIG. 2B, a coating process is performed to form a solder or gold (AU) 212a having a predetermined thickness on the exposed seed layer 208 and a reflow process is performed to form a bump 212 on the seed layer 208 as shown in FIG. 2C, thereby completing the fabrication process of sub semiconductor chip.

Figure 3A:
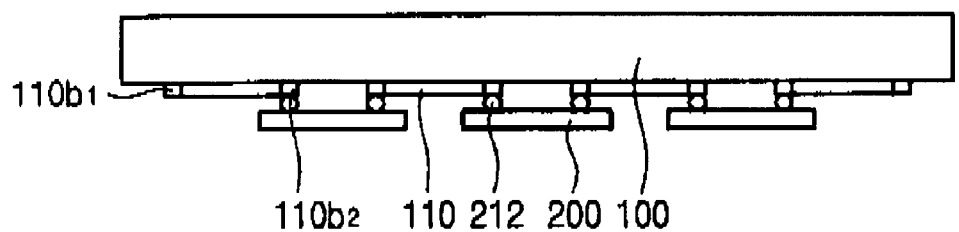
FIGS. 3A to 3C are drawings showing a process of forming a semiconductor package by using a main semiconductor chip and sub semiconductor chip according to a preferred embodiment of the present invention.
Figure 3B:
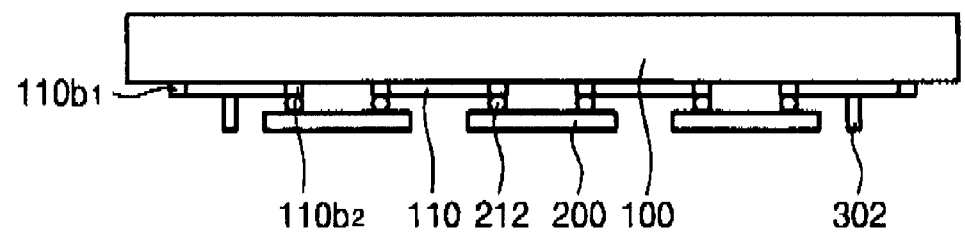
Figure 3C:
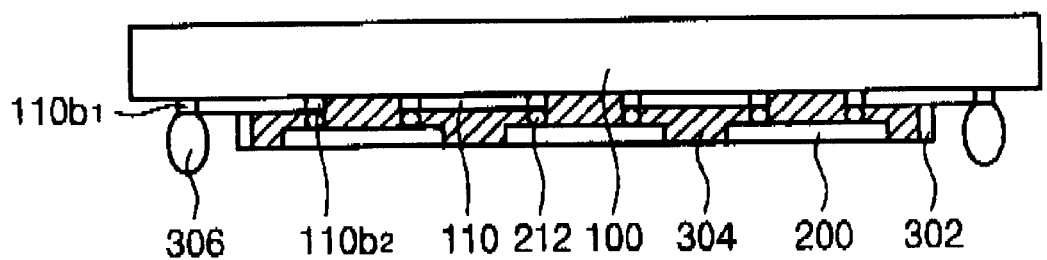
Figure 4:
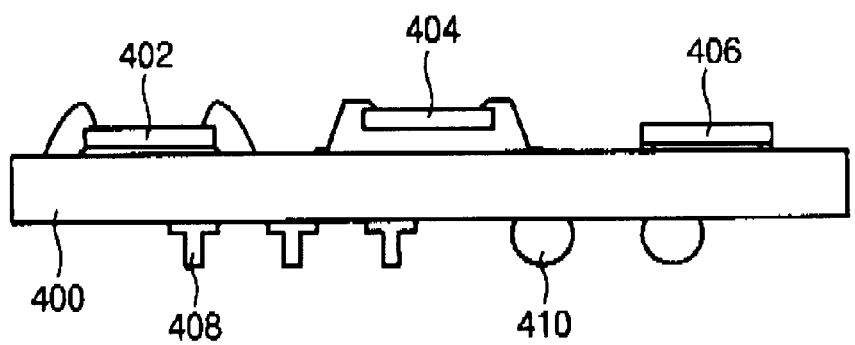
FIG. 4 is a cross-sectional view of conventional Multi Chip Module (MCM).
Figure 5:
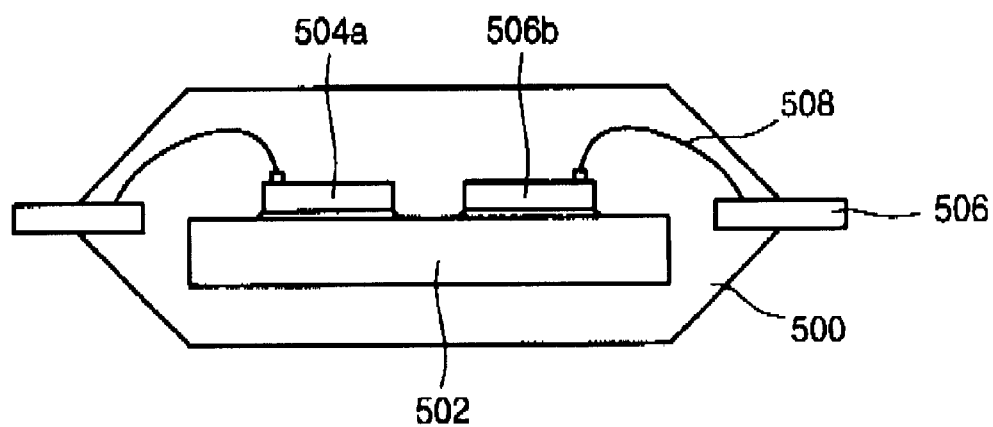
FIG. 5 is a cross-sectional view of conventional Multi Chip Package (MCP).

FIGS. 3A to 3C are drawings showing a process of forming a semiconductor package by using a main semiconductor chip and sub semiconductor chip according to a preferred embodiment of the present invention.

Referring to FIG. 3A, a flip chip bonding process is performed to adhere the sub semiconductor chip 200 to the main semiconductor chip 100 by adhering the bump 212 formed on the sub semiconductor chip 200 to corresponding electrode 110b1 or 110b2 on the main semiconductor chip 100. The main semiconductor chip and the sub semiconductor chip may be a microprocess and a memory, a microprocessor and a nonmemory or a memory and a nonmemory.

Referring to FIG. 3B, a dam 302 such as nonconductive polymer is formed on the outer peripheral part of the main semiconductor chip 100 in a shape surrounding the region not including the electrode 110b1 formed on the outer peripheral part of main semiconductor chip 100. The dam 302 has the same height to the sub semiconductor chip 200.

Subsequently, the dam 302 is filled up with filling materials 304 such as nonconductive polymer, and a large-sized solder ball 306 is adhered to the outer electrode 110b1 of the main semiconductor chip 100, to be higher than the sub semiconductor chip 200 by 0.1 mm to 5 mm. And then, the solder ball 306 is reflowed. As a result, a semiconductor package is completed, as shown in FIG. 3C.

As described above, the present invention has a structure that metal patterns including electrodes are formed on a main semiconductor chip operating as a lead frame or substrate and then, connected to corresponding pad (main chip pad) and bumps (solder bump or gold bump) are formed to be connected to corresponding pads (sub chip pad) on one or more sub semiconductor chips, wherein the sub semiconductor chip is adhered to the main semiconductor chip by adhering the bump to corresponding electrode of metal pattern and a dam is formed on the outer region of the main semiconductor chip in a shape surrounding the sub semiconductor chip, the inside thereof being filled with nonconductive polymer. Therefore, it is possible to realize small and compact size and to improve reliability on electrical properties of semiconductor package since semiconductor chips are connected directly by metal pattern.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A semiconductor package including a plurality of electrically-connected semiconductor chips, comprising:

a main semiconductor chip having a plurality of main chip pads and operating as a lead frame or a substrate;

a plurality of metal patterns electrically connected to each corresponding main chip pad and having electrodes formed on both ends;

one or more sub semiconductor chip adhered to the main semiconductor chip by adhering bumps formed on a plurality of sub chip pads to each corresponding electrode;

a dam formed on the main semiconductor chip in a shape surrounding inner electrodes except for outer peripheral electrodes on the an outmost region of the main semiconductor chip;

filling materials filled up in the dam; and a plurality of solder balls adhered on the outmost electrodes.

2. The semiconductor package according to claim 1, wherein the metal pattern comprises:

a lower barrier layer formed on the main chip pad;

a seed layer formed on the lower barrier layer; and a metal layer formed on the seed layer.

3. The semiconductor package according to claim 2, wherein the lower barrier layer comprises one selected from group consisting of Ti/W, Cr+Ni, Ti/W+Ni and Cr+Co+Ni, having a thickness of 2000 to 5000 Å, the seed layer comprises one selected from group consisting of Cu, Au, Cr and Ni, having a thickness of 1 to 5 $\mu$m and the metal layer is made of compounds such as Cu, Ni+Cu, Cu+Ni+Au or Cu+Au, having a thickness of 2 to 10 $\mu$m.

4. The semiconductor package according to claim 1, wherein the outer peripheral electrodes and the inner electrodes have a shape of circle, the inner electrodes having a diameter of 0.1 mm to 1 mm and the outer peripheral electrodes having a diameter of 0.3 mm to 3 mm.

5. The semiconductor package according to claim 1, wherein the outer peripheral electrodes and the inner electrodes have a shape of rectangle, the inner electrodes having a size of 0.1 mm×0.1 mm to 1 mm×1 mm and the outer peripheral electrodes having a size of 0.3 mm×0.3 mm to 3 mm×3 mm.

6. The semiconductor package according to claim 1, wherein the bump comprises solder or gold.

7. The semiconductor package according to claim 1, wherein the dam comprises nonconductive polymer, having the same height to the adhered sub semiconductor chip.

8. The semiconductor package according to claim 1, wherein the filling material comprises nonconductive polymer.

9. The semiconductor package according to claim 1, wherein the solder ball adhered to the outer peripheral electrodes are formed higher than the sub semiconductor chip by at least 0.1 mm to 5 mm.

* * * * *